United States Patent [19]
Smith et al.

[11] Patent Number: 5,597,035
[45] Date of Patent: Jan. 28, 1997

[54] FOR USE WITH A HEATSINK A SHROUD HAVING A VARYING CROSS-SECTIONAL AREA

[75] Inventors: Randall Smith, Georgetown; R. Steven Mills, Austin, both of Tex.

[73] Assignee: Dell USA, L.P., Austin, Tex.

[21] Appl. No.: 515,726

[22] Filed: Aug. 18, 1995

[51] Int. Cl.$^6$ .................................... F28F 7/00
[52] U.S. Cl. .................. 165/80.3; 165/147; 257/722; 361/697
[58] Field of Search ................. 165/80.3, 147; 361/690, 691, 692, 696, 697; 257/722, 721

[56] References Cited

U.S. PATENT DOCUMENTS

| | | | |
|---|---|---|---|
| 3,180,404 | 4/1965 | Nelson et al. | 165/80.3 X |
| 4,277,816 | 7/1981 | Dunn et al. | 165/80.3 X |
| 4,607,685 | 8/1986 | Mitchell, Jr. | 165/80.3 |
| 4,953,634 | 9/1990 | Nelson et al. | 165/80.3 X |
| 5,002,123 | 3/1991 | Nelson et al. | 165/80.3 X |

FOREIGN PATENT DOCUMENTS

| | | | |
|---|---|---|---|
| 2028355 | 1/1990 | Japan | 257/721 |
| 3135098 | 6/1991 | Japan | 361/690 |
| 5021666 | 1/1993 | Japan | 257/721 |
| 5095062 | 4/1993 | Japan | 257/721 |
| 5259325 | 10/1993 | Japan | 257/721 |

OTHER PUBLICATIONS

Simons, Micro–Modular Air–Cooling Scoop, Jun. 1979, pp. 240–241. An Enhancement of Heat Sink Using Air Collector and Duct, Mar. 1988.

*Primary Examiner*—John Rivell
*Assistant Examiner*—Christopher Atkinson
*Attorney, Agent, or Firm*—Haynes and Boone, L.L.P.

[57] ABSTRACT

The present invention provides a shroud for cooling a heatsink that is associated with a heat generating electrical component. Conventionally, the heatsink has a base portion with a first side and an oppositely disposed second side. The first side has cooling projections with outer ends that extend from the first side with the second side being attached to the heat generating electrical component. The shroud of the present invention comprises a wall that may be comprised of a thermoplastic or metallic material, The wall extends about and covers a portion of the cooling projections to form a passage for a flow of fluid about the cooling projections. The passage has a varying cross-sectional area to maximize the flow of the fluid about the cooling projections, to thereby enhance transfer of heat from the cooling projections to the fluid flowing through the passage. In one aspect, the varying cross-sectional area is formed by at least one of the walls surround the cooling projections having a concave shape projecting toward the cooling projections.

18 Claims, 3 Drawing Sheets

5,597,035

FOR USE WITH A HEATSINK A SHROUD HAVING A VARYING CROSS-SECTIONAL AREA

TECHNICAL FIELD OF THE INVENTION

The present invention is directed, in general, to a cooling system for a heat generating electrical component and, more specifically, to a shroud used in conjunction with a heatsink proximate to a heat-producing electronic component within a computer system.

BACKGROUND OF THE INVENTION

As computer systems grow in speed and shrink in size, power consumed within the computer per unit volume (power density) increases dramatically. Thus, it becomes evermore important to dissipate the heat generated by components within the computer during operation to ensure that the components remain within their normal operating temperature ranges. This reduces a chance that the components will fail immediately or have too short a lifetime.

In early desktop personal computers, components were passively cooled by radiation or convection, the surfaces of the components themselves interfacing directly with still air surrounding the component to transfer heat thereto. Unfortunately, air is not a particularly good conductor of heat. Therefore, in the early desktop computers, the heated air tended to become trapped, clinging to the components, acting as a thermal insulator and increasing component operating temperature. Eventually, computers were provided with fans to force air over the surfaces of the components, increasing the temperature differential between the surface of the component and the surrounding air to increase the efficiency of heat transfer. The increased temperature differential overcame some of the poor heat-conducting qualities of air.

Of all components in a computer, the microprocessor central processing unit ("CPU") liberates the most heat during operation of the computer. This springs from its role as the electrical center of attention in the computer. Thus, in prior art computers, motherboards were designed to position the CPU in the flow of air from a cooling fan; other heat-producing components were located away from the CPU to afford maximum cooling of the CPU.

As new generations of microprocessors have arrived, however, this relatively simple scheme has become decidedly inadequate, risking destruction of the CPU. It has become common to associate a heat sink with the CPU to increase the heat-dissipating surface area of the CPU for more effective cooling. Such heat sinks have a plurality of heat-dissipating projections or elements on a surface thereof (an "upper surface," for purposes of discussion). Another surface of the heat sink (the "lower surface") is placed proximate the component and a retention clip is employed to wrap around the heat sink, gripping a lower surface of the component with inward-facing projections.

Unfortunately, however, air, like electricity, takes the path of least resistance. As a result, air has a tendency to flow over and around the heatsink rather than through the fins or cooling projections of the heatsink, thus, requiring a fan having a higher airflow. To remedy this problem, shrouds have been developed to improve the efficiency of the heatsink. A conventional shroud works by limiting the area where the air can flow around the heatsink. Conventionally, a shroud comprises a three-sided, rectangularly shaped shield that is designed to fit over and around the heatsink on three sides, leaving a path through the shroud for the air to flow through the projections of the heatsink. However, even with conventionally designed shrouds, some air still travels above the heatsink, thereby reducing the efficiency of heat transfer because the conventional rectangular shape leaves room at the "upper portion" (for purposes of discussion) of the shroud. The space at the upper portion of the shroud is necessary to make the opening of the shroud as large as possible, within design limitations, to maximize the air flow through the shroud. While conventional shrouds greatly reduce the operating temperature of the CPU, the gap formed between the interior side of the shroud's wall and cooling projections, unfortunately, still allows air to by-pass the heatsink, which, of course reduces the efficiency of heat transfer from the CPU.

Accordingly, there is a need in the art for shroud that maximizes air flow capture and simultaneously increases the amount of air that passes over the heatsink. The present invention provides a heatsink shroud that addresses these needs.

SUMMARY OF THE INVENTION

To address the above-discussed deficiencies of the prior art, the present invention provides a shroud for cooling a heatsink that is associated with a heat generating electrical component. Conventionally, the heatsink has a base portion with a first side and an oppositely disposed second side. The first side has cooling projections with outer ends that extend from the first side, and the second side is attached to the heat generating electrical component. The shroud of the present invention comprises a wall, preferably comprised of a thermoplastic or metallic material, extending about and covering a portion of the cooling projections to form a passage for a flow of fluid about the cooling projections. The passage has a varying cross-sectional area to maximize the flow of the fluid about the cooling projections, to thereby enhance transfer of heat from the cooling projections to the fluid flowing through the passage. In a preferred embodiment, the cross-sectional area of the passage is concave.

In a preferred embodiment, the wall has a generally elongated rectangular shape comprised of a first side wall and an oppositely disposed second side wall, both transversely joined to an intermediate wall with the wall preferably extending along an entire length of the heatsink. In one aspect of this particular embodiment, the intermediate wall is concave toward the outer ends of the cooling projections, and in another aspect, the first side wall is concave toward the outer the cooling projections. Another alternate embodiment includes the second side wall being concave toward the cooling projections.

In yet another embodiment of the present invention, the passage has a fluid intake opening for receiving the fluid therethrough and an oppositely disposed fluid export opening from which the fluid is dischargeable from the passage, the fluid intake and fluid export openings each having a cross-sectional area greater than the varying cross-sectional area of the passage. Preferably the fluid intake opening is co-axial with a flow path of the fluid.

In yet another embodiment, there is provided a cooling apparatus for a heat generating electrical component. The cooling apparatus comprises a heatsink associated with the heat generating electrical component. The heatsink has a base portion with a first side and an oppositely disposed second side. The first side has cooling projections with outer ends that extends from the first side and the second side being attached to the heat generating electrical component.

Additionally, the cooling apparatus further comprises a shroud including a wall, preferably comprised of a thermoplastic or metallic material, extending about and covering a portion of the cooling projections to form a passage for a flow of fluid about the cooling projections. The passage has a varying cross-sectional area to maximize the flow of the fluid about the cooling projections, to thereby enhance transfer of heat from the cooling projections to the fluid flowing through the passage. In a preferred embodiment, the cross-sectional area of the passage is concave.

In a preferred embodiment, the wall has a generally elongated rectangular shape comprised of a first side wall and an oppositely disposed second side wall, both of which are transversely joined to an intermediate wall with the wall preferably extending along an entire length of the heatsink. In one aspect of this particular embodiment, the intermediate wall is concave toward the outer ends of the cooling projections, and in another aspect, the first side wall is concave toward the outer the cooling projections. Another alternate embodiment includes the second side wall being concave toward the cooling projections. Of course, if so desired, all three walls made be concave toward the cooling projections.

In yet another embodiment of the present invention, the passage has a fluid intake opening for receiving the fluid therethrough and an oppositely disposed fluid export opening from which the fluid is dischargeable from the passage, the fluid intake and fluid export openings each having a cross-sectional area greater than the varying cross-sectional area of the passage. Preferably the fluid intake opening is co-axial with a flow path of the fluid.

In yet another aspect of the present invention, there is provided a method of cooling a heat generating electrical component wherein the heat generating electrical component has a conventional heatsink associated therewith. The heatsink has a base portion with a first side and an oppositely disposed second side. The first side has cooling projections with outer ends that extend from the first side and the second side being attached to the heat generating electrical component. In this aspect, the method comprises the step of passing a flow of fluid through a shroud extending about and covering a portion of the heatsink. The shroud has a wall extending about and covering a portion of the cooling projections to form a passage for a flow of fluid about the cooling projections. Preferably, the wall is comprised of a thermoplastic or metallic material. The passage has a varying cross-sectional area to maximize the flow of the fluid about the cooling projections, to thereby enhance transfer of heat from the cooling projections to the fluid flowing through the passage.

In one aspect of the method, the step of passing preferably includes passing the fluid through a cross-sectional area of the passage having a concave shape.

In yet another, the step of passing includes the step of passing the fluid through the shroud wherein the wall has a generally elongated rectangular shape comprised of a first side wall and an oppositely disposed second side wall, both transversely joined to an intermediate wall.

In one aspect of this method, the step of passing includes passing the fluid through the passage wherein the intermediate wall is concave toward the outer ends of the cooling projections. Alternatively, either the first side wall is concave toward the cooling projections or the second side wall is concave toward the cooling projections.

Preferably, the step of passing includes passing the fluid through the passage wherein the wall extends along an entire length of the heatsink.

In yet another aspect of the present method, the step of passing includes the steps of receiving the fluid into the passage through a fluid intake opening and discharging the fluid through an oppositely disposed fluid export opening, the fluid intake and fluid export openings each having a cross-sectional area greater than the varying cross-sectional area of the passage. Preferably, the fluid intake opening is co-axial with a flow path of the fluid generated by a cooling fan within a personal computer.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
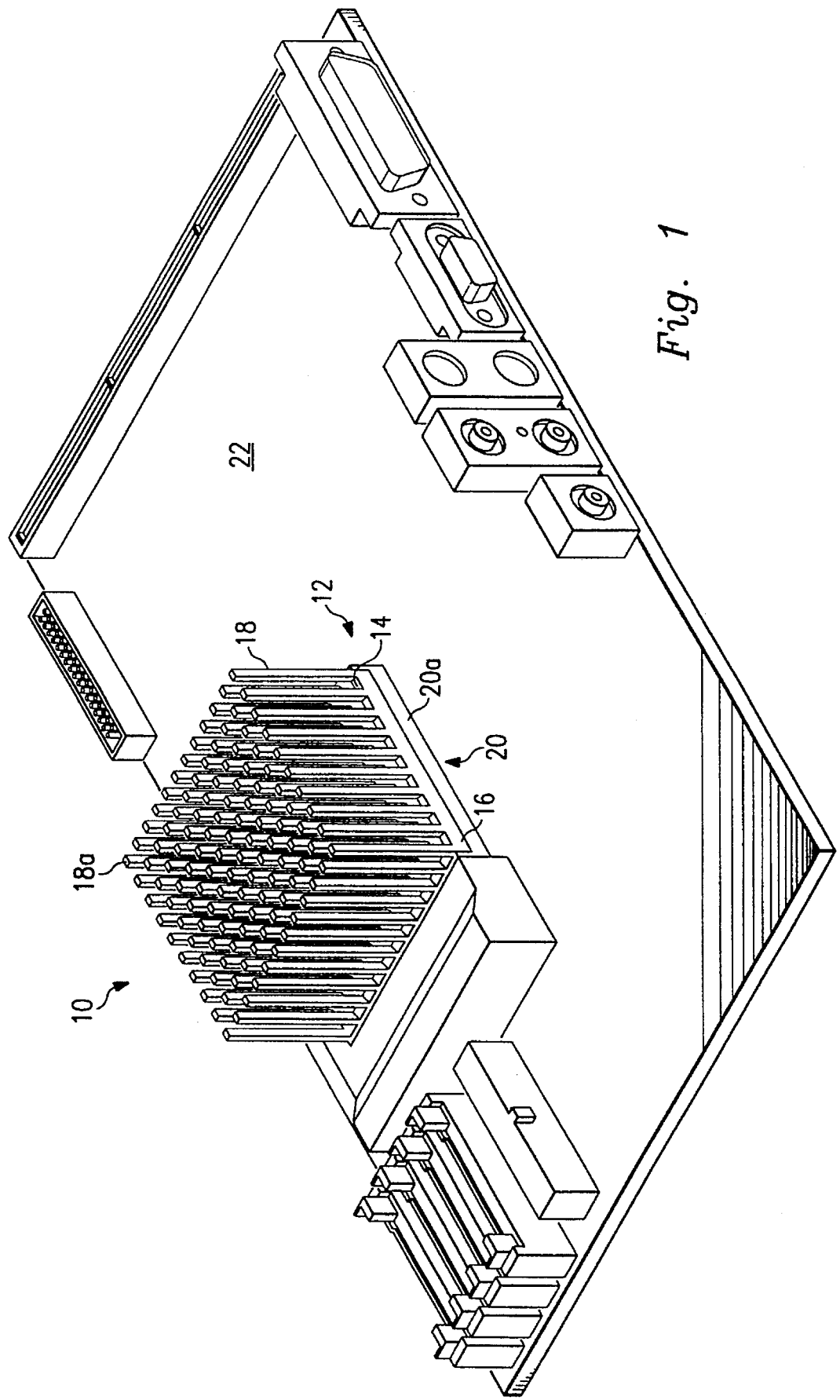
FIG. 1 illustrates a perspective view of a conventional heatsink attached to a electrical component.

Referring initially to FIG. 1, there is illustrated a conventional heatsink 10 with which the present invention is applicable. The heatsink 10 has a base portion 12 with a first side 14 and a second side 16. Cooling projections 18 having outer ends 18a extend from the first side 14 while the second side 16 is attached to a heat generating electrical component. An environment to which the heatsink 10 is particularly applicable is a computer apparatus environment. When used in this environment, the heatsink 10 is frequently attached to a heat generating electrical component 20, such as a central processing unit ("CPU") 20a that is attached to a motherboard 22 within an interior portion of the computer chassis (not shown). With today's high speed processors, it is essential that the CPUs be adequately cooled because of the high temperatures at which they operate. As heat is generated from the CPU 20a, it radiates from the second side 16 to the first side 14 of base portion 12. From the first side 14 the heat then radiates to the cooling projections 18 where it is dissipated into the surrounding environment. In most cases, a fan (not shown) will be present within the computer apparatus chassis that forces the cooling fluid (e.g. air) to flow around and between the cooling projections 18. The temperature differential between the cooling fluid and the cooling projections 18 causes a heat transfer from the heatsink 10 to the cooling fluid, which is then moved out from the computer chassis by the fan.

Figure 2:
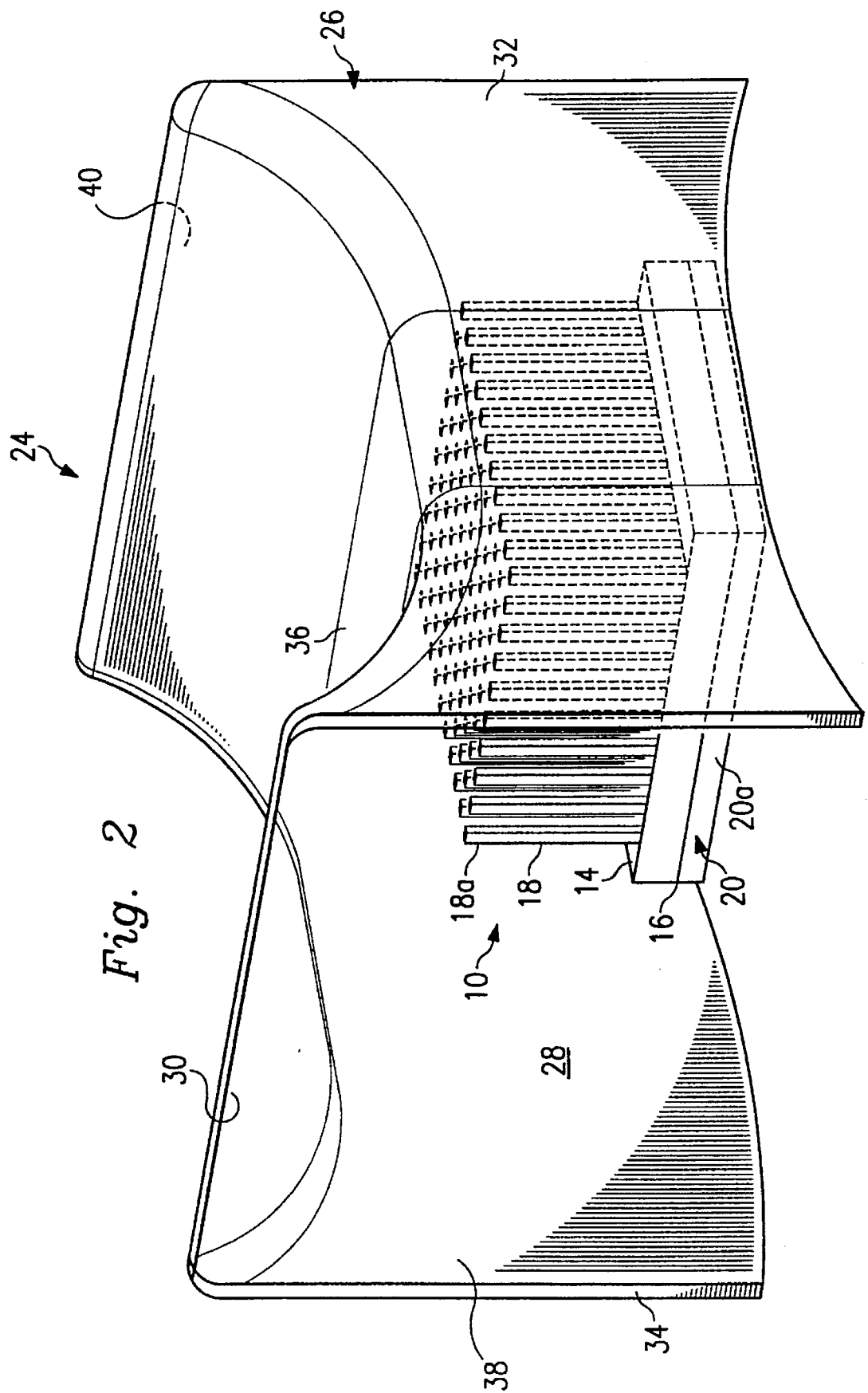
FIG. 2 illustrates a perspective, isometric view of a preferred embodiment of the shroud positioned about heatsink partially shown in phantom.

Turning now to FIG. 2, there is illustrated, in a preferred embodiment thereof, a shroud 24 of the present invention is positioned about the cooling projections 18 of the heatsink 10 that is partially shown in phantom. The shroud 24 comprises a wall 26 that extends about and covers a portion of the cooling projections 18 (FIG. 1) to form a passage 28 between the interior side 30 of the wall 26 and the heatsink 10 for a flow of fluid about the cooling projections 18. As shown, the shroud 24 preferably extends along the entire length of the heatsink 10 and covers three sides of the heatsink 10.

Preferably, the wall 26 is comprised of a thermoplastic or metallic material. In those instances where the wall 26 is comprised of a thermoplastic material, it will, of course, be appreciated that the thermoplastic material is capable of withstanding the high operating temperatures of the electrical component.

The passage 28 formed by the shroud 24 has a varying cross-sectional area that preferably has a concave shape projecting toward the cooling projections 18. The varying cross-sectional area maximizes the flow of the fluid about the cooling projections 18, to thereby enhance transfer of heat from the cooling projections to the fluid flowing through the passage 28. The way in which this unique shroud 24 enhances transfer of heat is explained in more detail below with reference to FIG. 5.

In a preferred embodiment, the wall 26 has a generally elongated rectangular shape comprised of a first side wall 32 and an oppositely disposed second side wall 34, both of which are transversely joined to an intermediate wall 36 with the wall preferably configured to extend along an entire length of the heatsink 10. Preferably, the intermediate wall 36 is concave toward the outer ends 18a of the cooling projections 18, and in another preferred embodiment, the first side wall 32 is concave toward the outer the cooling projections 18. In yet another alternate embodiment, the second side wall 34 is concave toward the cooling projections 18. Fluid flow about the cooling projections may be further maximized by having all three walls 32, 34 and 36 concave toward the respective sides of the cooling projections 18.

The passage 28 has a fluid intake opening 38 for receiving the fluid therethrough and a fluid export opening 40 from which the fluid is dischargeable from the passage. In a preferred embodiment, the fluid intake and fluid export openings 38, 40 each have a cross-sectional area greater than the varying cross-sectional area of the passage 28. Preferably the fluid intake opening 38 is co-axial with a flow path of the fluid.

Figure 3:
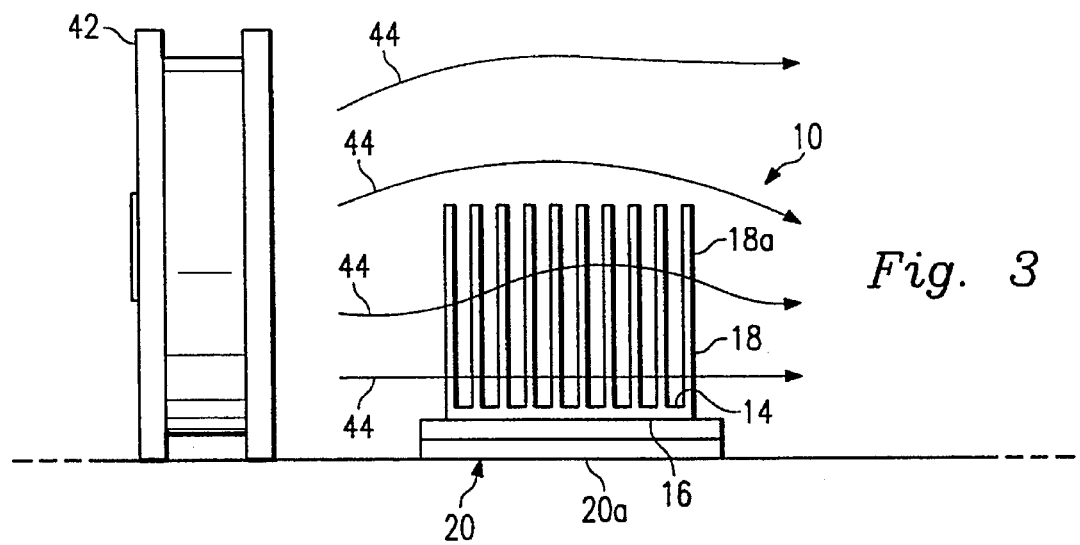
FIG. 3 illustrates a cross-sectional schematic view of a fluid flow around a heatsink without a shroud.

Turning now to FIG. 3, a fluid flow about a heatsink 10 is shown that does not incorporate the use of any type of shroud. As illustrated, the second side 16 of the conventional heatsink 10 is attached to a CPU 20a with the first side 14 of the heatsink 10 having cooling projections 18 extending outwardly therefrom. Both the heatsink CPU 20a configuration is positioned adjacent a fan 42 with no shroud extending about or covering any portion of the CPU. Since the air 44 follows the path of least resistance, more air 44 flows around the heatsink 10 than through the cooling projections 18. Thus, it is clearly seen that the air flow 44 about the cooling projections 18 is not maximized when no shroud is present. This configuration was tested, and it was found that in such instances, the CPU case temperature reached operating temperatures of 110° C., while the external ambient temperature was 35.0° C.

Figure 4:
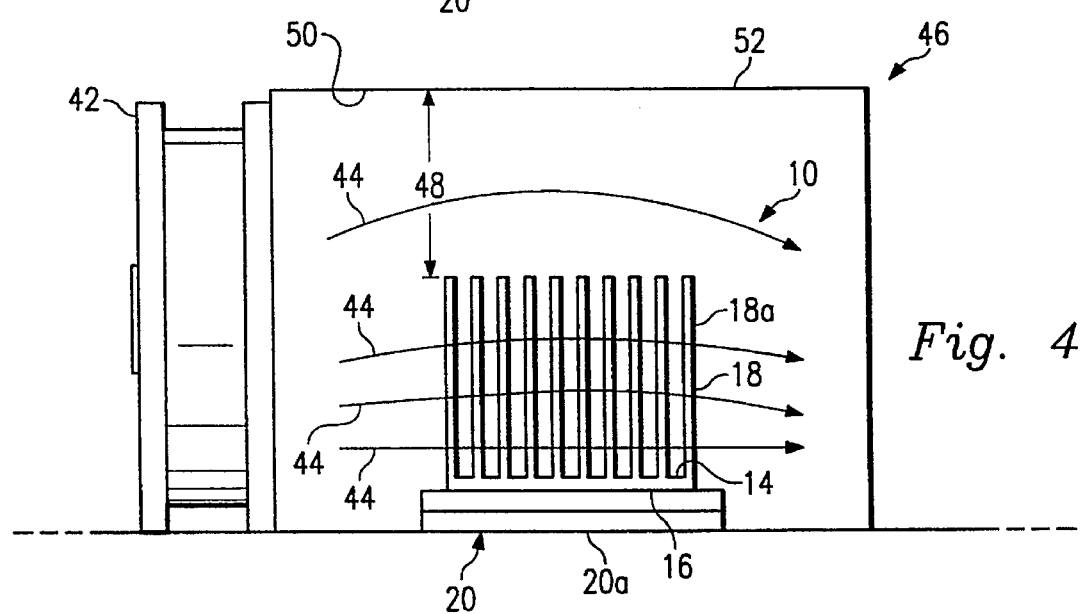
FIG. 4 illustrates a cross-sectional schematic view of a fluid flow around a heatsink having a simple shroud partially covering the heatsink.

Turning now to FIG. 4, a fluid flow about a heatsink 10 is shown that incorporates a simple shroud 46 (i.e. one that does not form a passage with a varying cross-sectional area). As illustrated, the second side 16 of the conventional heatsink 10 is attached to a CPU 20a with the first side 14 of the heatsink 10 having cooling projections 18 extending outwardly therefrom. Both the heatsink CPU 20a configuration is positioned adjacent a fan 42 with the simple shroud 46 extending from the fan 42 covering the CPU. While more air 44 flows through the cooling projections 18 with the application of the simple shroud 46 than without any type of shroud, the air 44 follows the path of least resistance, and more air 44 flows around the heatsink 10 than through the cooling projections 18. A reason that the air flow is not maximized with the use of the simple shroud 46 is that fan 42 is usually larger than the heatsink 10 so that are gaps 48 formed between the heatsink 10 and the interior side 50 of the wall 52 of the shroud 46. This configuration was tested, and it was found that in such instances, the CPU case temperature did decrease and reached operating temperatures of 67.5° C., while the external ambient temperature was 35.0° C.

Figure 5:
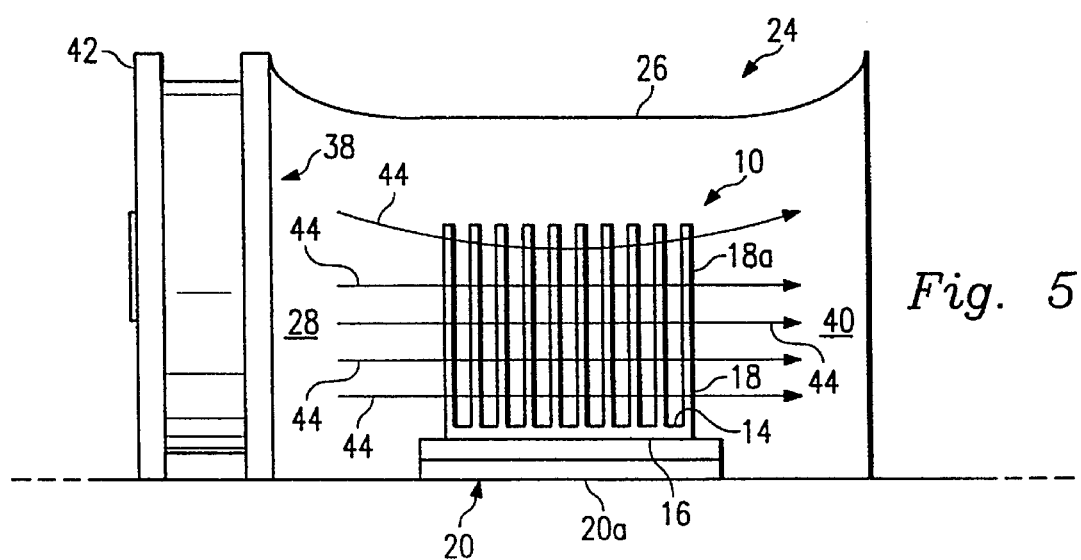
FIG. 5 illustrates a cross-sectional schematic view of a fluid flow around a heatsink having the shroud of the present invention partially covering the heatsink.

Referring now to FIG. 5, a fluid flow about a heatsink 10 is shown that incorporates the shroud 24 of the present invention. As illustrated, the second side 16 of the conventional heatsink 10 is attached to a CPU 20a with the first side 14 of the heatsink 10 having cooling projections 18 extending outwardly therefrom. In a preferred arrangement, the heatsink CPU 20a configuration is positioned adjacent a fan 42 with the shroud 24 extending from the fan 42 and covering the CPU. Preferably, the wall 26 extends to the fan 42 and the passage 28 is substantially coaxial with the flow of the fluid as illustrated; that is, the alignment of the passage 28 is such that a sufficient amount of fluid will flow through the passage 28 to effect an adequate amount of heat transfer from the heatsink 10. The shroud 24 of the present invention is unique in that its wall 26 configuration maximizes fluid flow about the cooling projections 18 of the heatsink 10, to thereby enhance transfer of heat from the cooling projections 18. In a preferred embodiment, the innovative configuration of the shroud 24 necks down as it gets closer to the heatsink 10. By reducing the cross-sectional area of the passage 28 as it passes the heatsink 10, the fluid is forced to pass directly through the cooling projections 18 of the heatsink 10. This, in turn, forces the fluid flow further towards the base portion 12 of the heatsink 10, which improves the cooling efficiency of the heatsink 10. This configuration was tested, and it was found that in such instances, the CPU case temperature decreased further and reached operating temperatures of 62.0° C., while the external ambient temperature was 35.0° C. Thus, it is clearly seen that the shroud 24 caused a substantial decrease in operating temperature when compared to the instance when no shroud was present. Furthermore, the operating temperature was further decreased by the shroud 24 of the present invention when even compared to the simple shroud 46 of FIG. 4.

With the shroud of the present invention having been described, a method for cooling a heat generating electrical component using the shroud will now be set forth with general reference to FIGS. 1, 2 and 5. Typically, the shroud will be used in conjunction with the heatsink that is attached to a CPU within a computer chassis. In these applications, a conventional cooling fan, such as a "biscuit fan" usually will be positioned immediately adjacent the shroud such that the air flow generated by the fan will move axially through the shroud passage and over the cooling projections of the heatsink. Preferably, the fluid (e.g. air) intake opening of the shroud contacts the fan so that the fluid flows from the fan and immediately into the passage formed by the shroud. As the fluid flows through the passage, the fluid begins to encounter a varying cross-sectional area of the passage that enhances the heat transfer from the heatsink to the fluid. The varying cross-sectional area is configured to direct more of the air flow through the cooling projections of the heatsink. As previously discussed, this cross-sectional area may be formed by one or more of the shroud's walls being concave in shape. As the air encounters the concave curvature, the concave wall directs the air toward the heatsink, thereby causing more air to flow through the cooling projections.

From the above description, it is apparent that the present invention provides a shroud for cooling a heatsink that is associated with a heat generating electrical component. Conventionally, the heatsink has a base portion with a first side and an oppositely disposed second side. The first side has cooling projections with outer ends that extend from the first side with the second side being attached to the heat generating electrical component. The shroud of the present invention comprises a wall that may be comprised of a thermoplastic or metallic material. The wall extends about and covers a portion of the cooling projections to form a passage for a flow of fluid about the cooling projections. The passage has a varying cross-sectional area to maximize the flow of the fluid about the cooling projections, to thereby enhance transfer of heat from the cooling projections to the fluid flowing through the passage. In one aspect, the varying cross-sectional area is formed by at least one of the walls surround the cooling projections having a concave shape projecting toward the cooling projections.

Although the present invention and its advantages have been described in detail, those skilled in the art should understand that they can make various changes, substitutions and alterations herein without departing from the spirit and scope of the invention in its broadest form.

What is claimed is:

1. For use with a heatsink associated with a heat generating electrical component, said heatsink having a base portion with a first side and an oppositely disposed second side, said first side having cooling projections with outer ends, said cooling projections extending from said first side and said second side being attached to said heat generating electrical component, a separate shroud selectively placeable over and about said heatsink comprising:

a wall extending about and covering a portion of said cooling projections to form a passage for a flow of fluid about said cooling projections, said wall having a generally elongated rectangular shape comprised of a first side wall and an oppositely disposed second side wall, both transversely joined to an intermediate wall and said first side wall is concave from front to back and toward said outer ends of said cooling projections, said passage having a varying cross-sectional area to maximize said flow of said fluid about said cooling projections, to thereby enhance transfer of heat from said cooling projections to said fluid flowing through said passage, and a fluid intake opening for receiving said fluid therethrough and an oppositely disposed fluid export opening from which said fluid is dischargeable from said passage, said fluid intake and fluid export openings each having a cross-sectional area greater than said varying cross-sectional area of said passage.

2. The shroud of claim 1 wherein said intermediate wall is concave toward said outer ends of said cooling projections.

3. The shroud of claim 1 wherein said second side wall is concave from front to back and toward said cooling projections.

4. The shroud of claim 1 wherein said wall extends along an entire length of said heatsink.

5. The shroud of claim 1 wherein said fluid intake opening is co-axial with a flow path of said fluid.

6. The shroud of claim 1 wherein said wall is comprised of a thermoplastic or metallic material.

7. A cooling apparatus for a heat generating electrical component, comprising:

a heatsink associated with said heat generating electrical component, said heatsink having a base portion with a first side and an oppositely disposed second side, said first side having cooling projections with outer ends, said cooling projections extending from said first side and said second side being attached to said heat generating electrical component; and a shroud including:

a wall extending about and covering a portion of said cooling projections to form a passage for a flow of fluid about said cooling projections, said wall having a generally elongated rectangular shape comprised of a first side wall concave from front to back and an oppositely disposed second side wall, both transversely joined to an intermediate wall, said passage having a varying cross-sectional area, a fluid intake opening for receiving said fluid therethrough and an oppositely disposed fluid export opening from which said fluid is dischargeable from said passage, said fluid intake and fluid export openings each having a cross-sectional area greater than said varying cross-sectional area of said passage to maximize said flow of said fluid about said cooling projections, to thereby enhance transfer of heat from said cooling projections to said fluid flowing through said passage.

8. The shroud of claim 7 wherein said intermediate wall is concave toward said outer ends of said cooling projections.

9. The shroud of claim 7 wherein said second side wall is concave from front to back and toward said cooling projections.

10. The shroud of claim 7 wherein said wall extends along an entire length of said heatsink.

11. The shroud of claim 7 wherein said fluid intake opening is co-axial with a flow path of said fluid generated by a cooling fan within a personal computer.

12. The shroud of claim 7 wherein said wall is comprised of a thermoplastic or metallic material.

13. A method of cooling a heat generating electrical component, said heat generating electrical component having a heatsink associated therewith, said heatsink having a base portion with a first side and an oppositely disposed second side, said first side having cooling projections with outer ends, said cooling projections extending from said first side and said second side being attached to said heat generating electrical component, said method comprising the step of:

placing a shroud about and over said heatsink after said heat sink is attached to said heat generating electrical component, said shroud having a wall extending about and covering a portion of said cooling projections to form a passage for a flow of fluid about said cooling projections, said wall having a generally elongated rectangular shape comprised of a first side wall and an oppositely disposed second side wall, both transversely joined to an intermediate wall and said first side wall being concave from front to back and toward said cooling projections, said passage having a varying cross-sectional area with a shape that is concave from front to back to maximize said flow of said fluid about said cooling projections, to thereby enhance transfer of heat from said cooling projections to said fluid flowing through said passage; and passing a flow of fluid through a fluid intake opening of the shroud and discharging said fluid through an oppositely disposed fluid export opening, said fluid intake and fluid export openings each having a cross-sectional area greater than said varying a cross-sectional area of said passage.

14. The method of claim 13 wherein said step of passing includes passing said fluid through said passage and said intermediate wall is concave toward said outer ends of said cooling projections.

15. The method of claim 13 wherein said step of passing includes passing said fluid through said passage and said second side wall is concave from front to back and toward said cooling projections.

16. The method of claim 13 wherein said step of passing includes passing said fluid through said passage and said wall extends along an entire length of said heatsink.

17. The method of claim 13 wherein said fluid intake opening is co-axial with a flow path of said fluid generated by a cooling fan within a personal computer.

18. The method of claim 13 wherein said step of passing includes the step of passing said fluid through a passage formed by said wall wherein said wall is comprised of a thermoplastic or metallic material.

\* \* \* \* \*